United States Patent
Chung

(10) Patent No.: US 9,767,733 B2
(45) Date of Patent: Sep. 19, 2017

(54) SCAN SENSE DRIVER AND DISPLAY DEVICE INCLUDING THE SAME

(71) Applicant: SAMSUNG DISPLAY CO., LTD., Yongin, Gyeonggi-Do (KR)

(72) Inventor: Kyung-Hoon Chung, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 80 days.

(21) Appl. No.: 14/670,674

(22) Filed: Mar. 27, 2015

(65) Prior Publication Data

US 2016/0117963 A1    Apr. 28, 2016

(30) Foreign Application Priority Data

Oct. 28, 2014    (KR) .................. 10-2014-0147490

(51) Int. Cl.
*G09G 3/32* (2016.01)
*G09G 3/3266* (2016.01)
*G09G 3/3208* (2016.01)
*G11C 19/28* (2006.01)

(52) U.S. Cl.
CPC ......... *G09G 3/3266* (2013.01); *G09G 3/3208* (2013.01); *G11C 19/28* (2013.01); *G09G 2310/0286* (2013.01); *G09G 2320/0295* (2013.01); *G09G 2320/045* (2013.01); *G09G 2330/12* (2013.01)

(58) Field of Classification Search
CPC .................. G09G 3/006; G09G 3/3266; G09G 2310/067; G09G 2310/08; G09G 2330/12
See application file for complete search history.

(56) References Cited

U.S. PATENT DOCUMENTS

| 2007/0040771 | A1 | 2/2007 | Chung et al. |
| 2011/0102418 | A1 | 5/2011 | Park |
| 2012/0113016 | A1* | 5/2012 | Lin .......................... G06F 3/044 345/173 |
| 2013/0257831 | A1* | 10/2013 | Kim ..................... G09G 3/3266 345/205 |

FOREIGN PATENT DOCUMENTS

| KR | 10-2007-0022550 A | 2/2007 |
| KR | 10-2011-0049122 A | 5/2011 |
| KR | 10-2014-0082498 A | 7/2014 |
| KR | 10-2014-0082503 A | 7/2014 |

* cited by examiner

*Primary Examiner* — Sahlu Okebato
(74) *Attorney, Agent, or Firm* — Lee & Morse, P.C.

(57) ABSTRACT

A scan sense driver includes a scan driver and a sense driver. The scan line driver provides a scan line enable signal based on a plurality of clock signals, a global clock signal, and a scan input signal during a scan time interval. The sense driver provides a sense enable signal based on the clock signals and a sense input signal during a sense time interval. The sense driver provides the sense enable signal during a period when an organic light-emitting diode of a pixel is to be tested for a malfunction.

20 Claims, 15 Drawing Sheets

FIG. 6

|  |  | SCAN TIME INTERVAL (SCTI) | SENSE TIME INTERVAL (SETI) |
|---|---|---|---|
| SCLK1 ~SCLK4 | TIME INTERVAL WHEN CLOCK SIGNALS MAINTAIN FIRST LOGIC LEVEL | 2H | ST |
|  | TIME INTERVAL BETWEEN ADJACENT CLOCK SIGNALS | 1H | ST |

|  |  | SCAN TIME INTERVAL (SCTI) | SENSE TIME INTERVAL (SETI) |
|---|---|---|---|
| SCLK1 ~SCLK4 | TIME INTERVAL WHEN CLOCK SIGNALS MAINTAIN FIRST LOGIC LEVEL | 1H | ST |
|  | TIME INTERVAL BETWEEN ADJACENT CLOCK SIGNALS | 1H | ST |

FIG. 10

|  | SCAN TIME INTERVAL (SCTI) | SENSE TIME INTERVAL (SETI) |
|---|---|---|
| SSP | SWING | HIGH |
| SESP | HIGH | SWING |

SCAN SENSE DRIVER AND DISPLAY DEVICE INCLUDING THE SAME

CROSS REFERENCE TO RELATED APPLICATION

Korean Patent Application No. 10-2014-0147490, filed on Oct. 28, 2014, and entitled "Scan Sense Driver and Display Device Including the Same," is incorporated by reference herein in its entirety.

BACKGROUND

1. Field

One or more embodiments described herein relate to a scan sense driver and display device including a scan sense driver.

2. Description of the Related Art

As the radiation time of an organic light-emitting diode increases, luminous efficiency may decrease. When the luminous efficiency of an organic light-emitting diode decreases, the image generated by a display device which includes the organic light-emitting diode may degrade.

SUMMARY

In accordance with one or more embodiments, a scan sense driver includes a scan line driver to provide a scan line enable signal based on a plurality of clock signals, a global clock signal, and a scan input signal during a scan time interval; and a sense driver to provide a sense enable signal based on the clock signals and a sense input signal during a sense time interval, wherein the sense driver is to provide the sense enable signal during a period when an organic light-emitting diode is to be tested for a malfunction.

Waveforms of the clock signals provided during the scan time interval may be different from the waveforms of the clock signals provided during the sense time interval. A time interval when the clock signals provided during the scan time interval have a first logic level may be a first time interval, a time interval when clock signals provided during the sense time interval have the first logic level may be a second time interval, and the second time interval is different from the first time interval. The sense input signal may have a second logic level during the scan time interval. The scan input signal may have a second logic level during the sense time interval.

A time interval between adjacent ones of the clock signals provided during the scan time interval may be a third time interval, and a time interval between adjacent ones of the clock signals provided during the sense time interval may be the second time interval. The first time interval may be greater than the third time interval. The first time interval may be longer than a horizontal time having a predetermined time interval, and the third time interval may be substantially equal to the horizontal time. The second time interval may be greater than the first time interval. The first time interval may be substantially equal to the third time interval. The first time interval and the third time interval may correspond to a horizontal time, and the horizontal time may have a predetermined time interval.

The sense driver may provide the sense enable signal based on a total operation time, and the total operation time may include a time when the scan sense driver is to operate. The sense driver may provide the sense enable signal when scan sense driver is turned-on.

In accordance with one or more embodiments, a display device includes a controller to provide a plurality of clock signals, a global clock signal, a scan start pulse, and a sense start pulse; a plurality of scan sense drivers to provide scan line enable signals and sense enable signals based on the clock signals, the global clock signal, the scan start pulse, and the sense start pulse; and a pixel array to operate based on the scan line enable signals and the sense enable signals, wherein each of the scan sense drivers includes: a scan line driver to provide the scan line enable signal based on the clock signals, the global clock signal, and a scan input signal during a scan time interval; and a sense driver to provide the sense enable signal based on the clock signals and a sense input signal during a sense time interval, wherein the sense driver is to provide the sense enable signal during a period when an organic light-emitting diode of a pixel in the pixel array is to be tested for a malfunction.

The scan input signal input into a first scan sense driver of the plurality of scan sense drivers may be the scan start pulse, and the sense input signal input into the first scan sense driver of the plurality of scan sense drivers may be the sense start pulse. The pixel may include a scan driver to provide a voltage corresponding to data voltage to a organic light-emitting diode; and a sensor to test for a malfunction of the organic light-emitting diode based on the sense enable signal.

The controller may control waveforms of the clock signals based on the scan time interval and the sense time interval. The controller may provide the clock signals, a time interval when the clock signals provided during the scan time interval may have a first logic level is a first time interval, a time interval when the clock signals provided during the sense time interval have the first logic level may be a second time interval, and the second time interval may be different from the first time interval.

A time interval between adjacent ones of the clock signals provided during the scan time interval may be a third time interval, a time interval between adjacent ones of the clock signals provided during the sense time interval may be the second time interval, the first time interval is greater than the third time interval, and the second time interval is greater than the first time interval. The first time interval may be equal to the third time interval, the first time interval and the third time interval may correspond to a horizontal time, and the horizontal time may be a predetermined time interval.

BRIEF DESCRIPTION OF THE DRAWINGS

Features will become apparent to those of skill in the art by describing in detail exemplary embodiments with reference to the attached drawings in which:

FIG. 6 illustrates an example of clock signals in scan and sense time intervals.

FIGS. 10 to 12 illustrate examples describing a scan input signal and a sense input signal in a scan time interval and a sense time interval;

DETAILED DESCRIPTION

Figure 1:
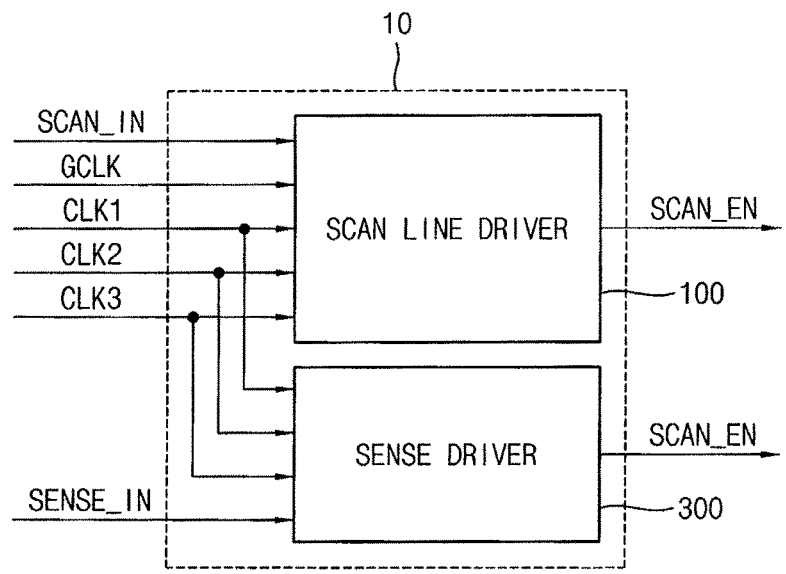
FIG. 1 illustrates an embodiment of a scan sense driver.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout.

FIG. 1 illustrates an embodiment of a scan sense driver 10 which includes a scan line driver 100 and a sense driver 300. The scan line driver 100 provides a scan line enable signal SCAN_EN based on a plurality of clock signals CLK1 to CLK3, a global clock signal GCLK, and a scan input signal SCAN_EN during a scan time interval SCTI. When the scan line enable signal SCAN_EN is enabled, a scan line corresponding to the scan line enable signal SCAN_EN is enabled.

The sense driver 300 provides a sense enable signal SENSE_EN based on the clock signals CLK1 to CLK3 and a sense input signal SENSE_IN during a sense time interval SETI. When the sense enable signal SENSE_EN is enabled, a sense enable transistor (e.g., 617 in FIG. 14) corresponding to the sense enable signal SENSE_EN may be turned-on. When the sense enable transistor is turned-on, a sensing voltage VS, transferred from a data voltage line VDATA_L, is transferred to the organic light-emitting diode (e.g., 615 in FIG. 14) through the sense enable transistor. When the sensing voltage VS is transferred to the organic light-emitting diode through the sense enable transistor, a corresponding sensing current IS is transferred to the data voltage line (e.g., VDATA_L in FIG. 14) through the sense enable transistor.

Figure 13:
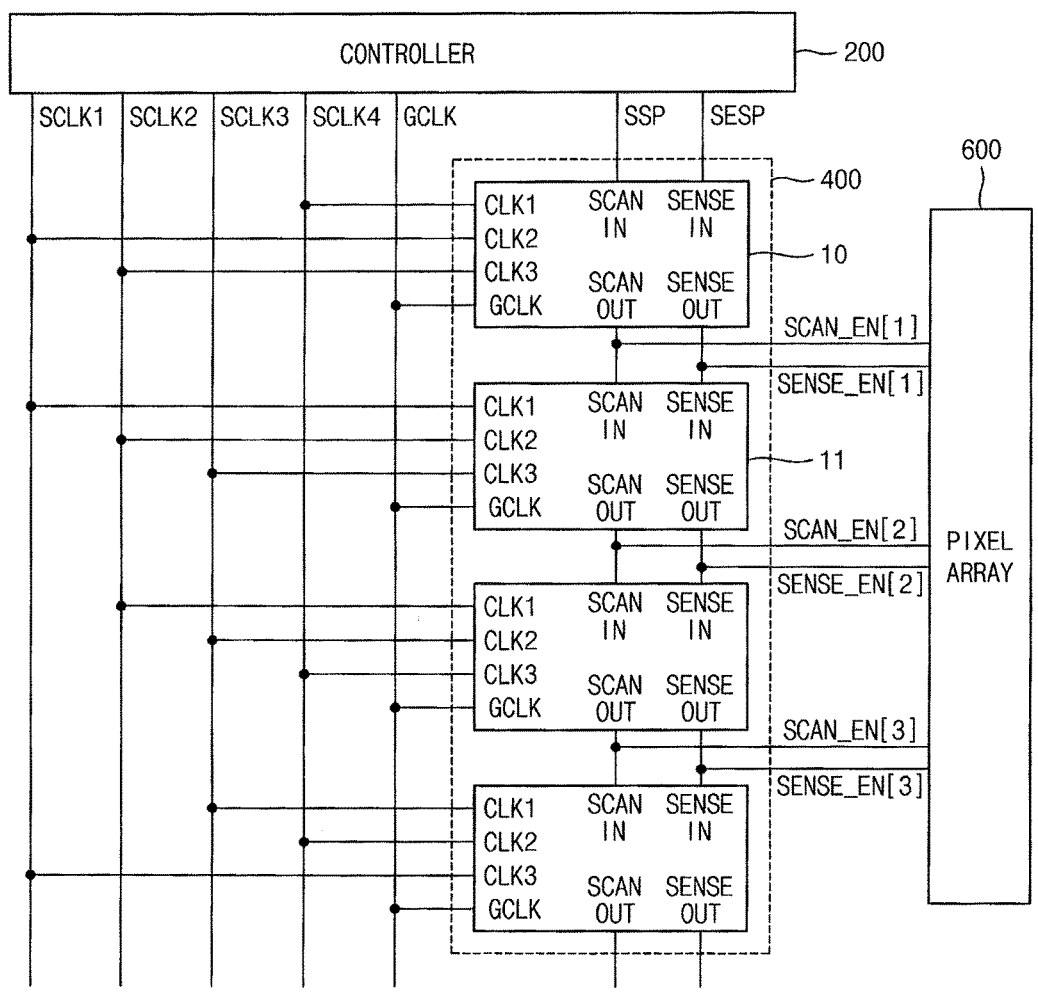
FIG. 13 illustrates an embodiment of a display device.
Figure 14:
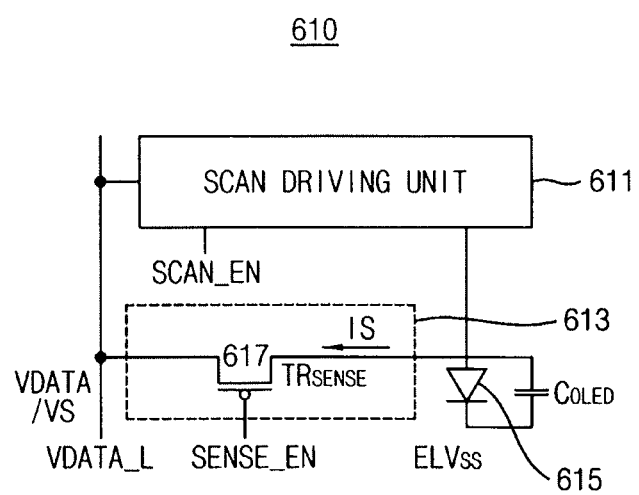
FIG. 14 illustrates an embodiment of a pixel of the display device.

A malfunction, or other abnormal state, of the organic light-emitting diode may be tested based on the sensing current IS. The scan time interval SCTI may be a time interval to enable the scan line. The sense time interval SETI may be a time interval to test malfunction of the organic light-emitting diode, which, for example, may be included in a pixel array (e.g., 600 in FIG. 13) of a display device. (The circuits in FIGS. 13 and 14 are merely illustrative of one non-limiting embodiment. Different circuits may be used for purposes of testing malfunction of an organic light-emitting diode in another embodiment).

The scan line driver 100 provides the scan line enable signal SCAN_EN based on the clock signals CLK1 to CLK3, the global clock signal GCLK, and the scan input signal SCAN_IN during the scan time interval SCTI. The sense driver 300 provides the sense enable signal SENSE_EN based on the clock signals CLK1 to CLK3 and the sense input signal SENSE_IN during the sense time interval SETI. For example, the clock signals CLK1 to CLK3 input into the scan line driver 100 may be equal to the clock signals CLK1 to CLK3 input into the sense driver 300. Therefore, when the scan sense driver 10 is used, the sense enable signal SENSE_EN may be generated by applying the clock signals CLK1 to CLK3 to the sense driver 300. In one embodiment, separate pins for the clock signals CLK1 to CLK3 input into the sense driver 300 are not used. In this case, the layout area may be decreased.

Figure 2:
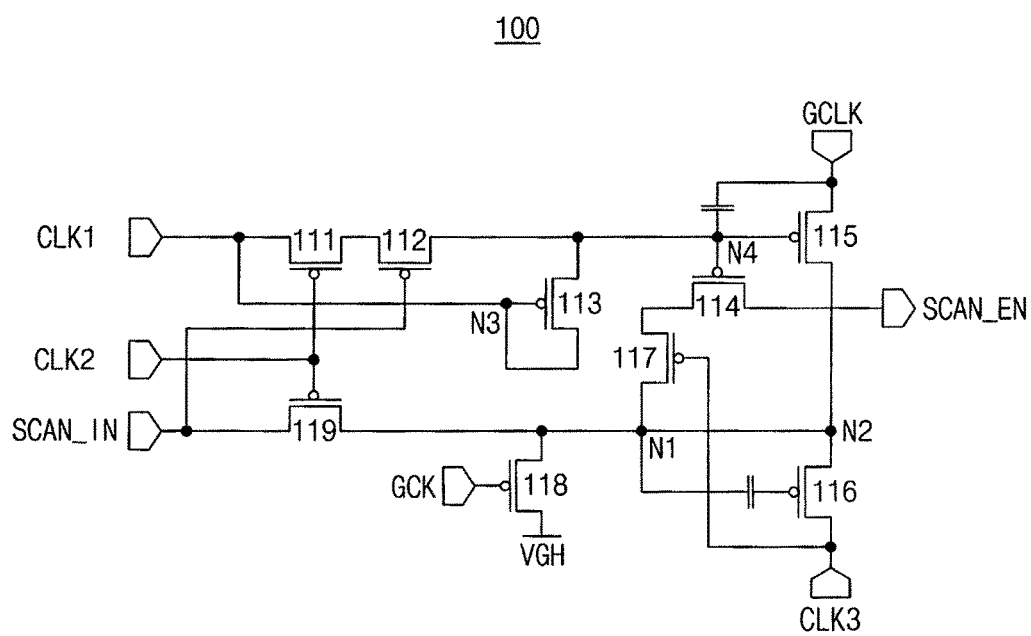
FIG. 2 illustrates an embodiment of a scan line driver.
Figure 3:
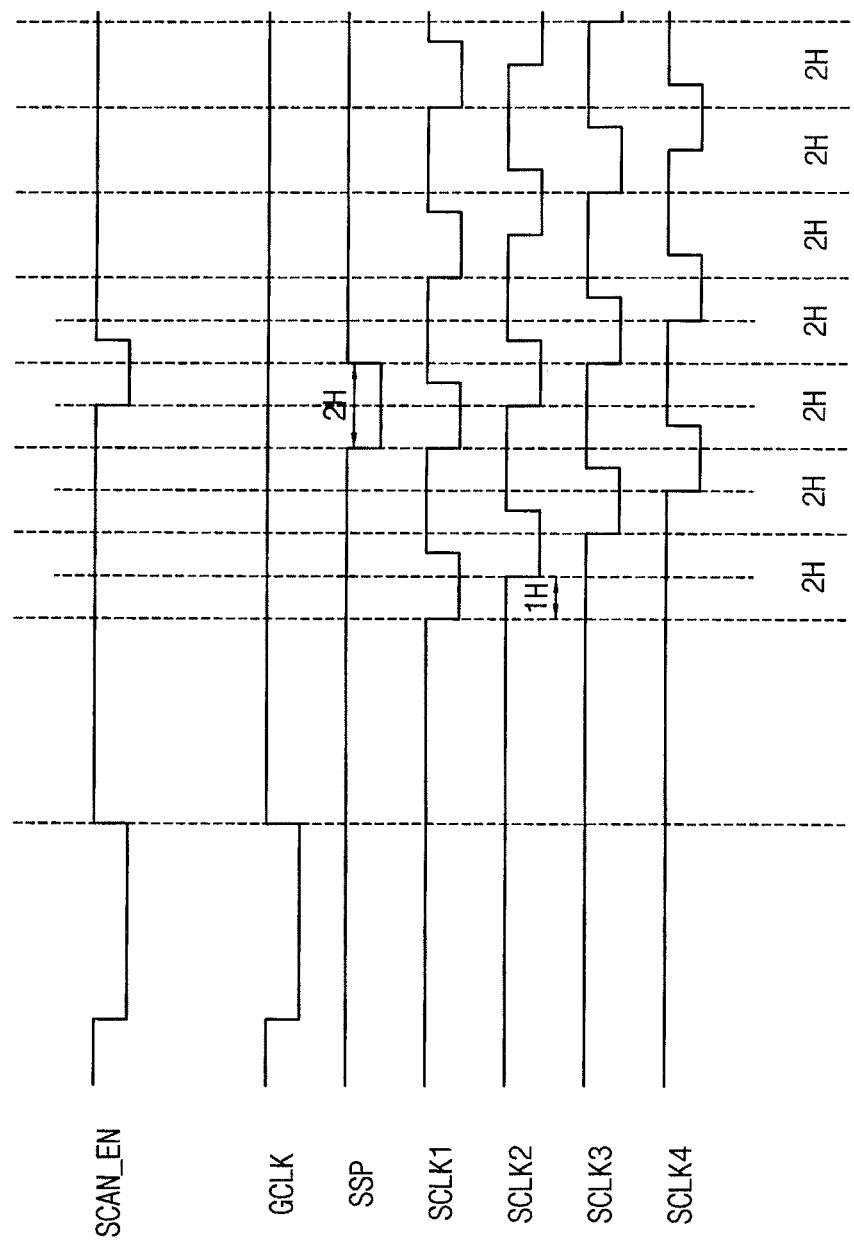
FIG. 3 illustrates an example of control signals for the scan line driver.

FIG. 2 illustrates an embodiment of a scan line driver 100, which, for example, may correspond to the scan line driver 10 in FIG. 1. FIG. 3 is a timing diagram for describing an example of the operation the scan line driver 100 of FIG. 2.

Referring to FIGS. 2 and 3, the scan line driver 100 includes a plurality of scan transistors 111 to 119. The scan line driver 100 provides the scan line enable signal SCAN_EN based on the clock signals CLK1 to CLK3, the global clock signal GCLK, and the scan input signal SCAN_IN during the scan time interval SCTI. As will be described with reference to FIG. 13, the clock signals CLK1 to CLK3, the global clock signal GCLK, and the scan input signal SCAN_IN may be provided, for example, from a controller (e.g., 200 in FIG. 13).

The clock signals CLK1 to CLK3 may be selected from among a plurality of S-clock signals, e.g., first to fourth S-clock signals SCLK1 to SCLK4. For example, the first clock signal CLK1 may be the fourth S-clock signal SCLK4. The second clock signal CLK2 may be the first S-clock signal SCLK1. The third clock signal CLK3 may be the second S-clock signal SCLK2. The scan input signal SCAN_IN may be a scan start pulse SSP.

The clock signals may have different logic levels. For example, when the first clock signal CLK1 is at a logic low level, the first scan transistor 113 connected to the third node N3 may be turned-on. When the first scan transistor 113 is turned-on, the fourth node N4 may be at a logic low level. When the fourth node N4 is at a logic low level, the second scan transistor 115 may be turned-on. When the second scan transistor 115 is turned-on, the scan line enable signal SCAN_EN may be at a logic high level.

Subsequently, the scan input signal SCAN_IN that is the scan start pulse SSP may be at a logic low level and the second clock signal CLK2 may be at a logic low level. When the second clock signal CLK2 is at a logic low level, the third scan transistor 119 may be turned-on. When the third scan transistor 119 is turned-on, the scan input signal SCAN_IN at a logic low level may be transferred to the first node N1. When the first node N1 is at a logic low level, the fourth scan transistor 116 may be turned-on. When the fourth scan transistor 116 is turned-on, the scan line enable signal SCAN_EN may be the third clock signal CLK3. In this case, the scan line enable signal SCAN_EN may at a logic low level.

Figure 4:
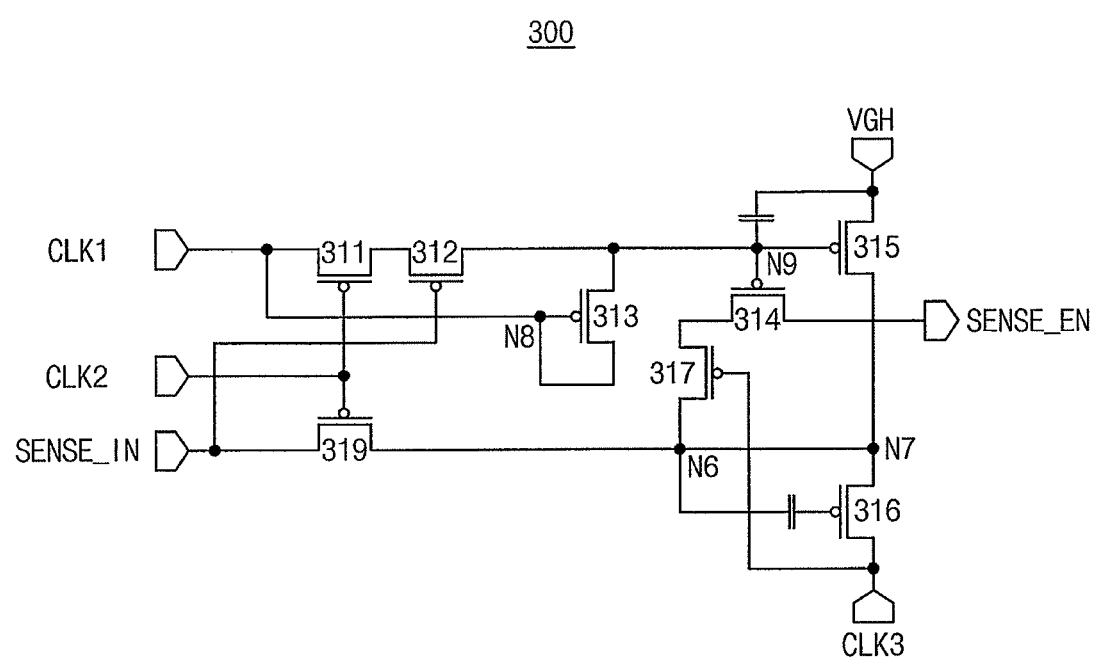
FIG. 4 illustrates an embodiment of a sense driver.
Figure 5:
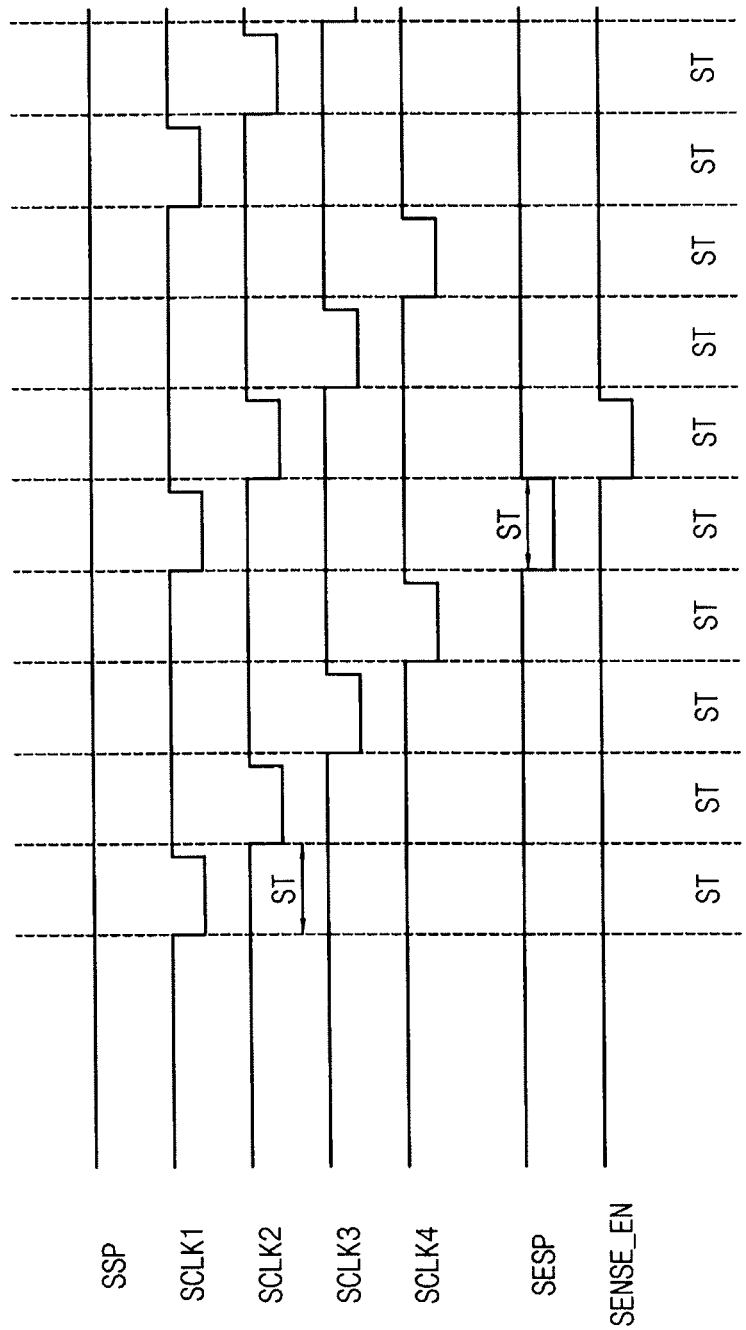
FIG. 5 illustrates an example of control signals for the sense driver.

FIG. 4 illustrates an embodiment of a sense driver, which, for example, may be the sense driver 300 in FIG. 1. FIG. 5 is a timing diagram describing an example of the operation of the sense driver 300 of FIG. 4.

Referring to FIGS. 4 and 5, the sense driver 300 includes a plurality of sense transistors 311 to 317 and 319. The sense driver 300 provides the sense enable signal SENSE_EN based on the clock signals CLK1 to CLK3 and the sense input signal SENSE_IN during the sense time interval SETI. The clock signals CLK1 to CLK3 and the sense input signal SENSE_IN may be provided, for example, from a controller (e.g., 200 in FIG. 13).

The clock signals CLK1 to CLK3 may be selected from among a plurality of S-clock signals, e.g., first to fourth S-clock signals SCLK1 to SCLK4. For example, the first clock signal CLK1 may be the fourth S-clock signal SCLK4. The second clock signal CLK2 may be the first S-clock signal SCLK1. The third clock signal CLK3 may be the second S-clock signal SCLK2. The sense input signal SENSE_IN may be a sense start pulse SESP.

The clock signals may have different logic levels. For example, when the first clock signal CLK1 is at a logic low level, the first sense transistor 313 connected to the eighth node N8 may be turned-on. When the first sense transistor 313 is turned-on, the ninth node N9 may be at a logic low level. When the ninth node N9 is at a logic low level, the second sense transistor 315 may be turned-on. When the second sense transistor 315 is turned-on, sense enable signal SENSE_EN may be at a logic high level.

Subsequently, the sense input signal SENSE_IN that is, the sense start pulse SESP, may be at a logic low level and the second clock signal CLK2 may be at a logic low level. When the second clock signal CLK2 is at a logic low level, the third sense transistor 319 may be turned-on. When the third sense transistor 319 is turned-on, the sense input signal SENSE_IN at a logic low level, may be transferred to the sixth node N6. When the sixth node N6 is at a logic low level, the fourth sense transistor 316 may be turned-on. When the fourth sense transistor 316 is turned-on, the sense enable signal SENSE_EN may be the third clock signal CLK3. In this case, the sense enable signal SENSE_EN may be at a logic low level.

FIG. 6 illustrates an example of clock signals in the scan time interval and the sense time interval SETI. Referring to FIGS. 3, 5 and 6, waveforms of the clock signals CLK1 to CLK3 provided during the scan time interval SCTI may be different from the waveforms of the clock signals CLK1 to CLK3 provided during the sense time interval SETI. In an example embodiment, a time interval during which the clock signals CLK1 to CLK3 provided during the scan time interval SCTI maintain a first logic level may be a first time interval. A time interval during which the clock signals CLK1 to CLK3 provided during the sense time interval SETI maintain a first logic level may be a second time interval ST. The second time interval ST may be different from the first time interval. For example, the first logic level may at a logic low level, and the second logic level may be at a logic high level. The first time interval may be longer (e.g., two times longer) than a horizontal time 1H. The horizontal time 1H may be a predetermined time interval. The horizontal time 1H may be a time interval when, for example, the scan line is enabled.

The sense time interval SETI may be a time interval to test whether an organic light-emitting diode (e.g., 615 in FIG. 14) is malfunctioning or otherwise in an abnormal state. The time interval when the clock signals CLK1 to CLK3 provided during the scan time interval SCTI maintain the first logic level may be a time interval when the scan line is enabled. The time interval when the clock signals CLK1 to CLK3 provided during the sense time interval SETI maintain the first logic level may be a time interval when the sense enable transistor (e.g., 617 in FIG. 14) is enabled to test the malfunction of the organic light-emitting diode.

In one embodiment, the sense time interval SETI may be greater than the scan time interval SCTI. In addition, the time interval when the clock signals CLK1 to CLK3 provided during the sense time interval SETI maintain the first logic level may be greater than the time interval when the clock signals CLK1 to CLK3 provided during the scan time interval SCTI maintain the first logic level. The second time interval ST may be greater than, for example, several microseconds.

In an example embodiment, the time interval between adjacent clock signals CLK1 to CLK3 provided during the scan time interval SCTI may be a third time interval. For example, during the scan time interval SCTI, the time interval between the time when the first S-clock signal SCLK1 transitions from a logic high level to a logic low level and a time when the second S-clock signal SCLK2 transitions from a logic high level to a logic low level, may be the third time interval. The third time interval may be the horizontal time 1H having a period that is predetermined.

In an example embodiment, the time interval between adjacent clock signals of the clock signals CLK1 to CLK3 provided during the sense time interval SETI may be the second time interval ST. For example, during the sense time interval SETI, the time interval between the time when the first S-clock signal SCLK1 transitions from a logic high level to a logic low level and the time when the second S-clock signal SCLK2 transitions from a logic high level to a logic low level may be the second time interval ST. The second time interval ST may be greater than, for example, several microseconds.

In an example embodiment, the first time interval may be greater than the third time interval. For example, the first time interval may be longer (e.g., two times longer) than a horizontal time 1H. The third time interval may be equal to the horizontal time 1H. In this case, the first time interval may be greater than the third time interval.

In an example embodiment, the second time interval ST may be greater than the first time interval. For example, the first time interval may be a time interval when the clock signals CLK1 to CLK3 provided during the scan time interval SCTI maintain the first logic level. The second time interval ST may be a time interval when the clock signals CLK1 to CLK3 provided during the sense time interval SETI maintain the first logic level. The scan time interval SCTI may be a time interval to enable the scan line. The sense time interval SETI may be a time interval to test whether the organic light-emitting diode 615 is malfunctioning or otherwise in an abnormal state. The first time interval may be, for example, less than several microseconds, and the second time interval ST may be, for example, greater than several microseconds.

Figure 7:
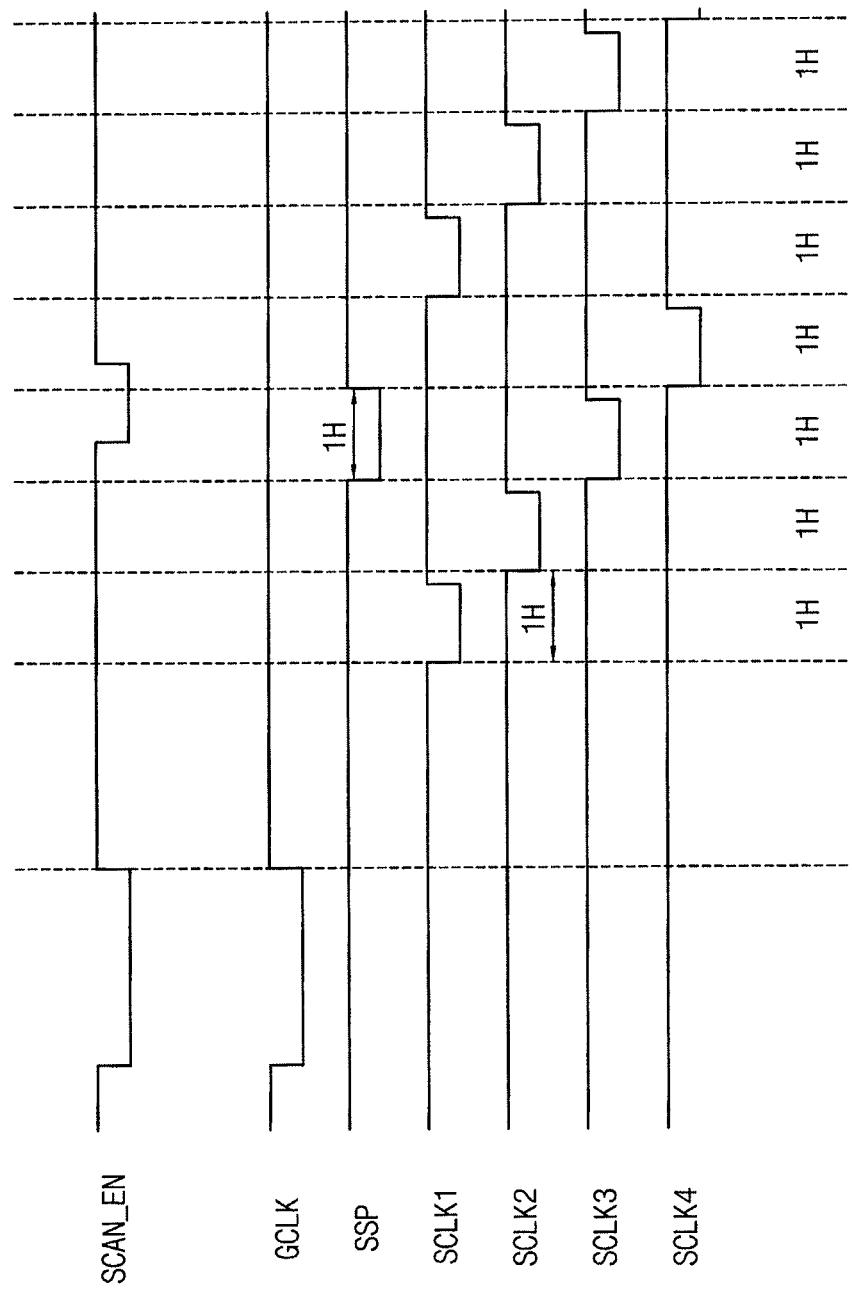
FIG. 7 illustrates another example of control signals for the scan line driver.
Figures 8, 9:
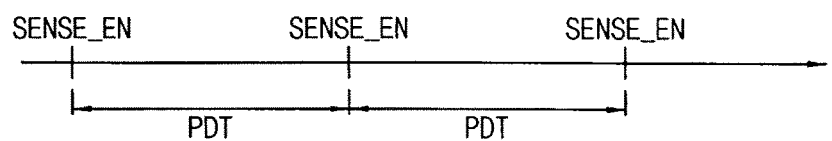
FIG. 8 illustrates another example of clock signals in scan and sense time intervals.
FIG. 9 illustrates an example of the operation of sense driver of FIG. 1.

FIG. 7 is a timing diagram describing another example of the operation of the scan line driver 100 in FIG. 2. FIG. 8 illustrates another example of clock signals in a scan time interval and a sense time interval.

Referring to FIGS. 7 and 8, the first time interval may be equal to the third time interval. The first time interval may be a time interval when the clock signals CLK1 to CLK3 provided during the scan time interval SCTI maintain the first logic level. The time interval when the clock signals CLK1 to CLK3 maintain the first logic level may be a time interval when the scan line is enabled. The third time interval may be a time interval between adjacent ones of the clock signals CLK1 to CLK3. For example, during the scan time interval SCTI, the time interval between the time when the First S-clock signal SCLK1 transitions from a logic high level to a logic low level and the time when the second S-clock signal SCLK2 transitions from a logic high level to a logic low level may be the third time interval.

For example, the first logic level may be a logic low level and the second logic level may be a logic high level. For example, the first time interval and the third time interval may be a horizontal time 1H. The horizontal time 1H may be a predetermined time interval. In this case, a time interval when the clock signals CLK1 to CLK3 provided during the sense time interval SETI maintain the first logic level may be a second time interval ST.

FIG. 9 illustrates a diagram for describing operation of the sense driver 300 of FIG. 1 according to one embodiment. Referring to FIGS. 4, 5, and 9, the sense driver 300 may include the sense transistors 311 to 317 and 319. The sense driver 300 provides the sense enable signal SENSE_EN based on the clock signals CLK1 to CLK3 and the sense input signal SENSE_IN during the sense time interval SETI. The clock signals CLK1 to CLK3 and the sense input signal SENSE_IN may be provided from a controller (e.g., 200 in FIG. 13). The clock signals CLK1 to CLK3 may be selected among a plurality of S-clock signals, e.g., first to fourth S-clock signals SCLK1 to SCLK4.

In an example embodiment, the sense driver 300 may provide the sense enable signal SENSE_EN based on a total operation time. The total operation time may be, for example, a time when the scan sense driver 10 operates. In one embodiment, if the total operation time of scan line driver 100 reaches a predetermined time PDT, the sense driver 300 may provide the sense enable signal SENSE_EN to test the malfunction of the organic light-emitting diode (e.g., 615 in FIG. 14).

In an example embodiment, when the scan sense driver 10 is turned-on, the sense driver 300 provides the sense enable signal SENSE_EN. For example, whenever the scan sense driver 10 is turned-on, the sense driver 300 provides the sense enable signal SENSE_EN to test the malfunction of the organic light-emitting diode. In one embodiment, when the sense enable signal SENSE_EN is enabled, the sense enable transistor (e.g., 617 in FIG. 14) corresponding to the sense enable signal SENSE_EN may be turned-on. When the sense enable transistor is turned-on, the sensing voltage VS transferred from the data voltage line VDATA_L may be transferred to the organic light-emitting diode (e.g., 615 in FIG. 14) through the sense enable transistor. When the sensing voltage VS is transferred to the organic light-emitting diode through the sense enable transistor, a corresponding sensing current IS may be transferred to the data voltage line VDATA_L through the sense enable transistor. Malfunction of the organic light-emitting diode 615 may be tested based on the sensing current IS.

Figure 11:
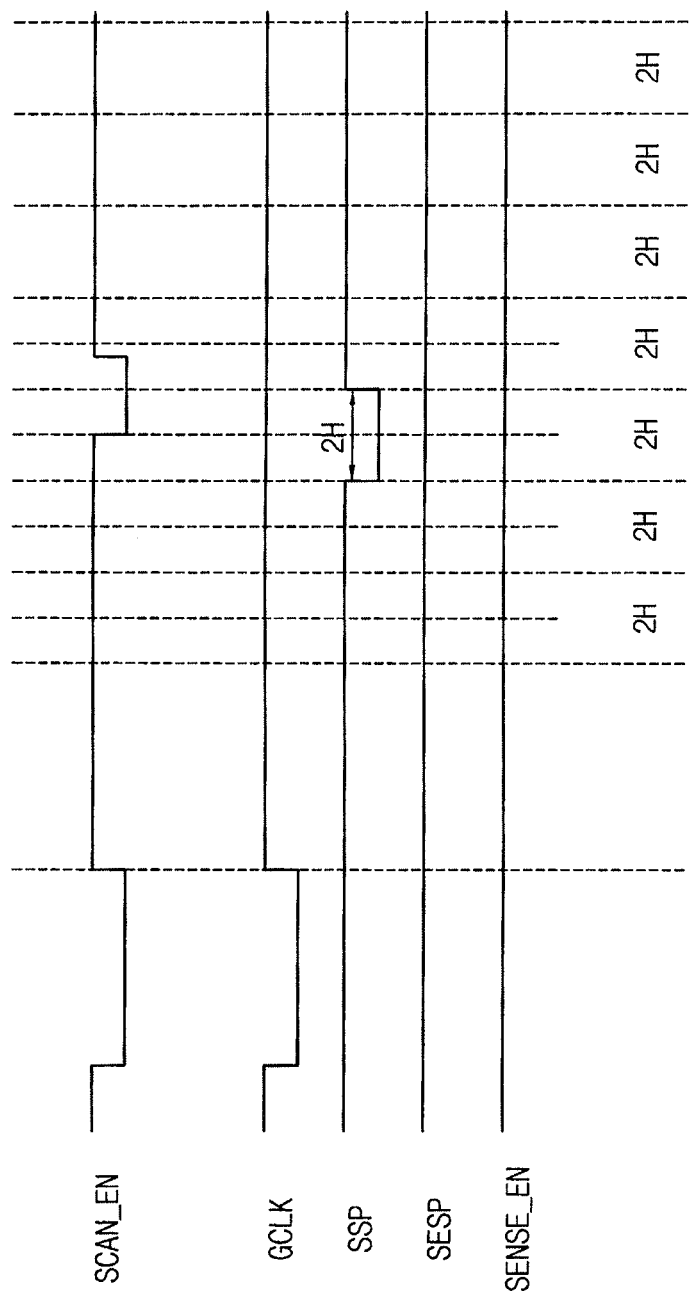
Figure 12:
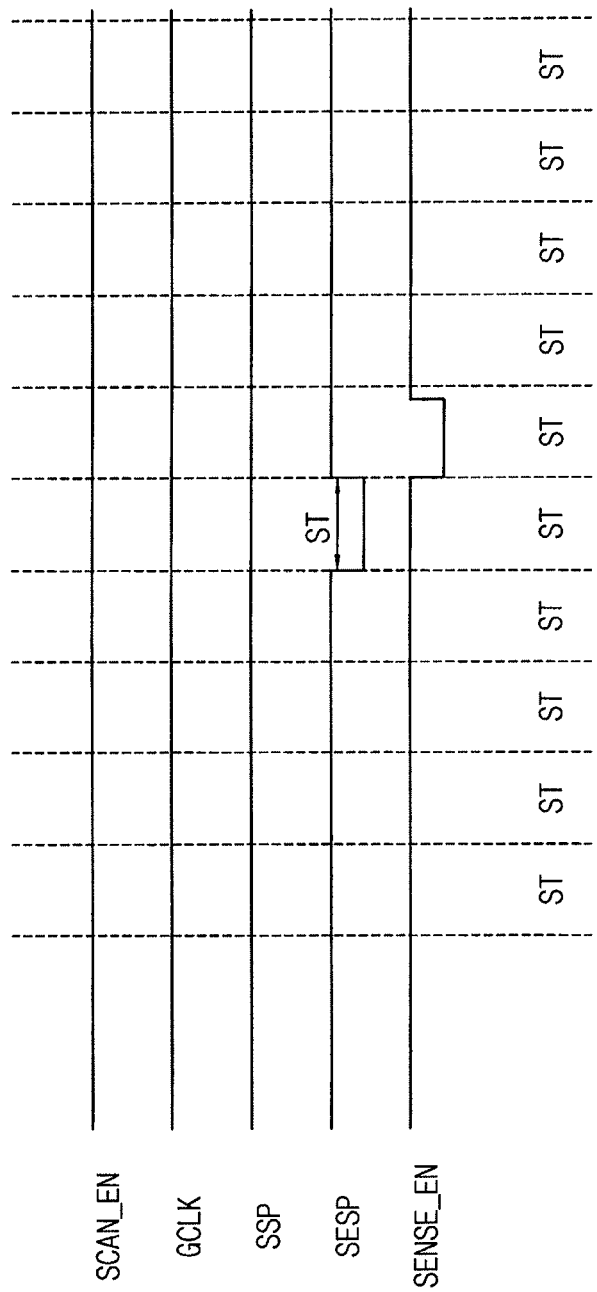

FIGS. 10 to 12 illustrate examples of a scan input signal and a sense input signal in a scan time interval and a sense time interval. Referring to FIGS. 10 to 12, during the scan time interval SCTI when the scan line is enabled, a display device including the scan sense driver 10 may not perform a sensing operation to test the malfunction of the organic light-emitting diode (e.g., 615 in FIG. 14). In addition, during the sense time interval SETI when malfunction of the organic light-emitting diode 615 is tested, the display device may not perform the operation of transferring the data voltage VDATA by enabling the scan line.

For example, the sense input signal SENSE_IN may be a second logic level during the scan time interval SCTI. The first logic level may be a logic low level and the second logic level may be a logic high level. When the sense input signal SENSE_IN is the second logic level during the scan time interval SCTI, the sensing operation may be stopped. The sense input signal SENSE_IN may be the sense start pulse SESP. For example, the scan input signal SCAN_IN may be a second logic level during the sense time interval SETI. When the scan input signal SCAN_IN is the second logic level during the sense time interval SETI, the operation of transferring the data voltage VDATA by enabling the scan line may be stopped. The scan input signal SCAN_IN may be the scan start pulse SSP.

FIG. 13 illustrates an embodiment of a display device 20 and FIG. 14 illustrates an embodiment of a pixel 610 which may be included in the display device 20.

Referring to FIGS. 13 and 14, the display device 20 includes a controller 200, at least one scan sense driver unit 400, and a pixel array 600. The controller 200 outputs a plurality of clock signals CLK1 to CLK3, a global clock signal GCLK, a scan start pulse SSP, and a sense start pulse SESP. The scan sense driver unit 400 includes a plurality of scan sense drivers. In FIG. 13, the scan sense driver unit is illustratively shown in to include four scan sense drivers 10, 11, 12, and 13. In another embodiment, the scan sense driver unit 400 may include another number of scan sense drivers. Each of the scan sense drivers 10, 11, 12, and 13 may have a structure, for example, as in FIG. 1.

The scan sense driver unit 400 provides scan line enable signals SCAN_EN[1] to SCAN_EN[3] and sense enable signals SENSE_EN[1] to SENSE_EN[3] based on the clock signals CLK1 to CLK3, the global clock signal GCLK, the scan start pulse SSP, and the sense start pulse SESP. The pixel array 600 operates based on the scan line enable signals SCAN_EN[1] to SCAN_EN[3] and the sense enable signals SENSE_EN[1] to SENSE_EN[3].

Each of the scan sense drivers in the scan sense driver unit 400 may include a scan line driver 100 and a sense driver 300, for example, as illustrated in FIG. 1. The scan line driver 100 provides the scan line enable signal SCAN_EN based on the clock signals CLK1 to CLK3, the global clock signal GCLK, and a scan input signal SCAN_IN during a scan time interval SCTI. The sense driver 300 provides the sense enable signal SENSE_EN based on the clock signals CLK1 to CLK3 and a sense input signal SENSE_IN during a sense time interval SETI.

For example, the sense driver 300 may provide the sense enable signal SENSE_EN. When the scan line enable signal SCAN_EN is enabled, the scan line corresponding to the scan line enable signal SCAN_EN is enabled. The scan time interval SCTI may be a time interval to enable the scan line. The sense time interval SETI may be a time interval to test for malfunction of the organic light-emitting diode 615 in the pixel array 600.

In an example embodiment, the scan input signal SCAN_IN input into the first scan sense driver 10 may be the scan start pulse SSP. The sense input signal SENSE_IN input into the first scan sense driver 10 may be the sense start pulse SESP. In addition, the scan input signal SCAN_IN input into a second scan sense driver 11 may be the first scan enable signal. The sense input signal SENSE_IN input into the second scan sense driver 11 may be the first sense enable signal SENSE_EN[1]. The signals into and out of scan sense drivers 12 and 13 may be provided in a similar manner.

In an example embodiment, the pixel 610 in the pixel array 600 includes a scan driving unit 611 and a sensing unit 613. The scan driving unit 611 provides a voltage corresponding to data voltage VDATA to an organic light-emitting diode 615. The sensing unit 613 may test a state of the organic light-emitting diode 615 based on the sense enable signal SENSE_EN. For example, when the sense enable signal SENSE_EN is enabled, the sense enable transistor 617 corresponding to the sense enable signal SENSE_EN may be turned-on. When the sense enable transistor 617 corresponding to the sense enable signal SENSE_EN is turned-on, the sensing voltage VS transferred from the data voltage line VDATA_L may be transferred to the organic light-emitting diode 615 through the sense enable transistor 617. When the sensing voltage VS is transferred to the organic light-emitting diode 615 through the sense enable transistor 617, the corresponding sensing current IS may be transferred to the data voltage line VDATA_L through the sense enable transistor 617. Malfunction of the organic light-emitting diode 615 may be tested using the sensing current IS.

Figure 15:
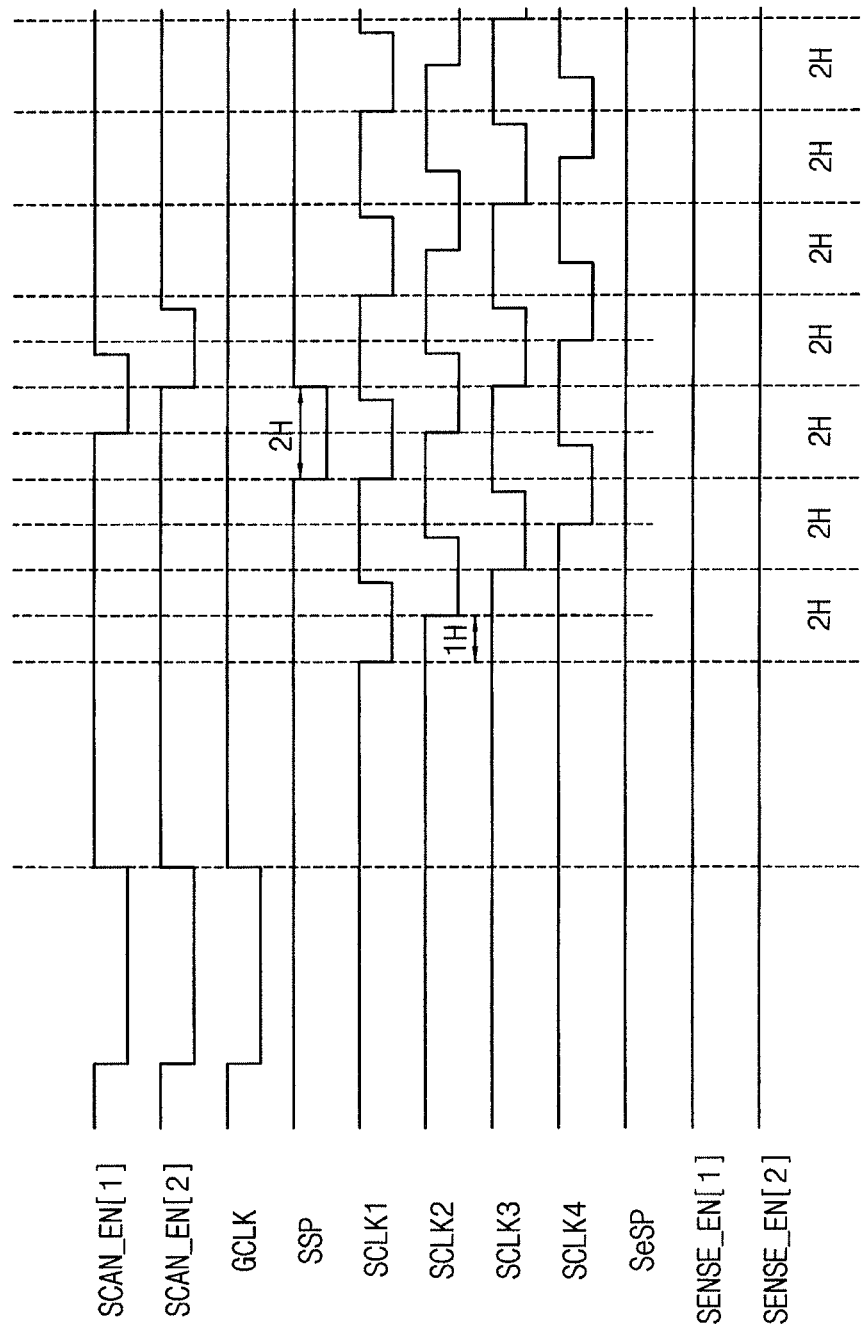
FIG. 15 illustrates an example of control signals for the display device.

FIG. 15 illustrates another example of control signals for a display device, which, for example, may be display device 20 in FIG. 13, during a scan time interval SCTI.

Referring to FIGS. 2, 13, and 15, the scan line driver 100 may include the scan transistors 111 to 119. The scan line driver 100 provides the scan line enable signal SCAN_EN based on the clock signals CLK1 to CLK3, the global clock signal GCLK, and the scan input signal SCAN_IN during the scan time interval SCTI. The clock signals CLK1 to CLK3, the global clock signal GCLK, and the scan input signal SCAN_IN may be provided from the controller 200 to the first scan sense driver 10.

The clock signals CLK1 to CLK3 may be selected among a plurality of S-clock signals, e.g., first to fourth S-clock signals SCLK1 to SCLK4. For example, the first clock signal CLK1 may be the fourth S-clock signal SCLK4. The second clock signal CLK2 may be the first S-clock signal SCLK1. The third clock signal CLK3 may be the second S-clock signal SCLK2. In this case, the scan input signal SCAN_IN may be a scan start pulse SSP.

For example, when the first clock signal CLK1 is a logic low level, the first scan transistor 113 connected to the third node N3 may be turned-on. When the first scan transistor 113 is turned-on, the fourth node N4 may be at a logic low level. When the fourth node N4 is at a logic low level, the second scan transistor 115 may be turned-on. When the second scan transistor 115 is turned-on, the scan line enable signal SCAN_EN may be at a logic high level.

Subsequently, the scan input signal SCAN_IN that is the scan start pulse SSP may be at a logic low level and the second clock signal CLK2 may be at a logic low level. When the second clock signal CLK2 is at a logic low level, the third scan transistor 119 may be turned-on. When the third scan transistor 119 is turned-on, the scan input signal SCAN_IN that is at a logic low level may be transferred to the first node N1. When the first node N1 is at a logic low level, the fourth scan transistor 116 may be turned-on. When the fourth scan transistor 116 is turned-on, the scan line enable signal SCAN_EN may be the third clock signal CLK3.

In this case, the first scan line enable signal SCAN_EN[1] may be at a logic low level. The scan input signal SCAN_IN input into the second scan sense driver 11 may be the first scan line enable signal SCAN_EN[1]. In the second scan line driver 100, the second scan line enable signal SCAN_EN[2] may be generated in the same manner.

Figure 16:
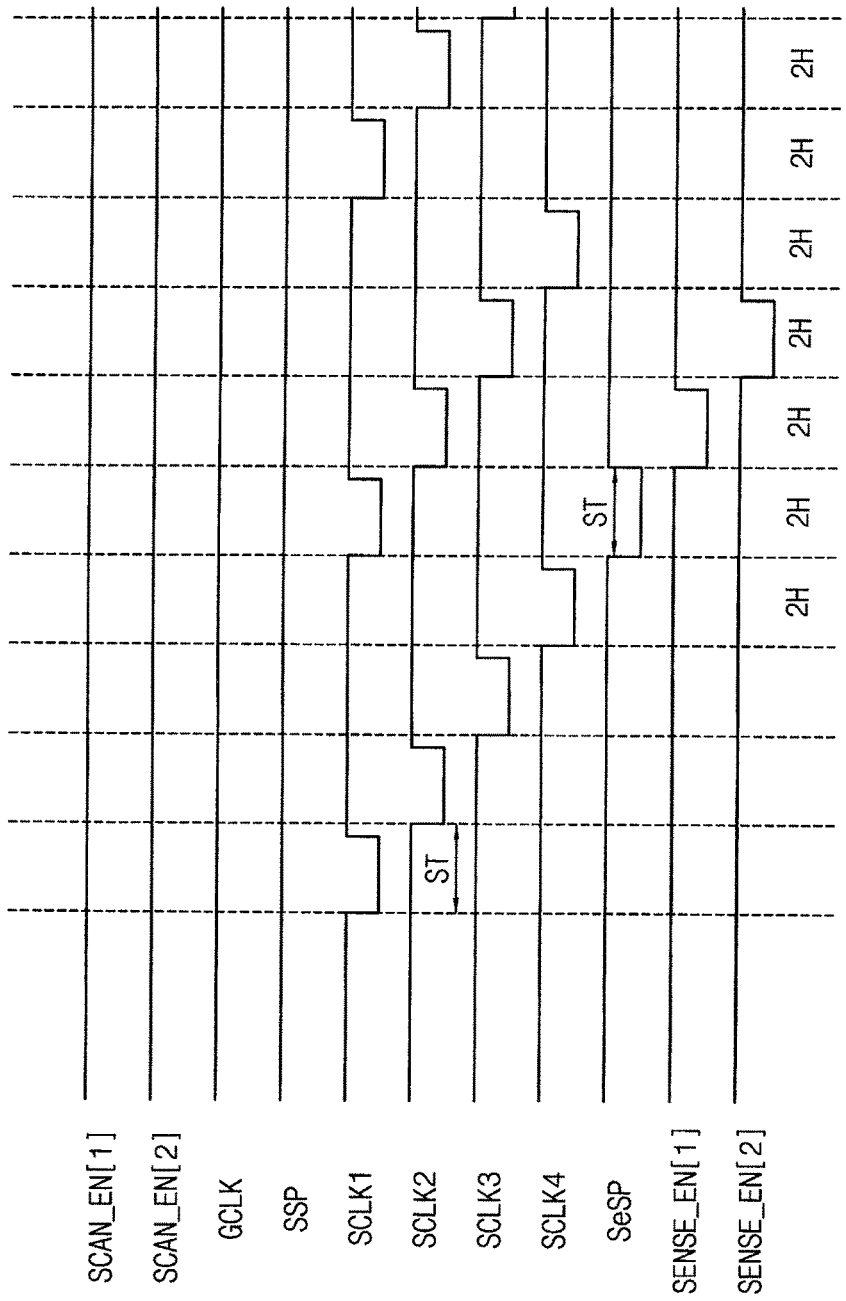
FIG. 16 illustrates an example of control signals for the display device during a sense time interval.

FIG. 16 illustrates another example of control signals for a display device, which, for example, may be display device 20 in FIG. 13, during a sense time interval.

Referring to FIGS. 4, 13, and 16, the sense driver 300 may include the sense transistors 311 to 317 and 319. The sense driver 300 provides the sense enable signal SENSE_EN based on the clock signals CLK1 to CLK3 and the sense input signal SENSE_IN during the sense time interval SETI. The clock signals CLK1 to CLK3 and the sense input signal SENSE_IN may be provided from the controller 200 to the first scan sense driver 10.

The clock signals CLK1 to CLK3 may be selected from among a plurality of S-clock signals, e.g., first to fourth S-clock signals SCLK1 to SCLK4. For example, the first clock signal CLK1 may be the fourth S-clock signal SCLK4. The second clock signal CLK2 may be the first S-clock signal SCLK1. The third clock signal CLK3 may be the second S-clock signal SCLK2. The sense input signal SENSE_IN may be a sense start pulse SESP.

For example, when the first clock signal CLK1 is at a logic low level, the first sense transistor 313 connected to the eighth node N8 may be turned-on. When the first sense transistor 313 is turned-on, the ninth node N9 may be at a logic low level. When the ninth node N9 is at a logic low level, the second sense transistor 315 may be turned-on. When the second sense transistor 315 is turned-on, the sense enable signal SENSE_EN may be at a logic high level.

Subsequently, the sense input signal SENSE_IN that is the sense start pulse SESP may be at a logic low level and the second clock signal CLK2 may be at a logic low level. When the second clock signal CLK2 is at a logic low level, the third sense transistor 319 may be turned-on. When the third sense transistor 319 is turned-on, the sense input signal SENSE_IN that is at a logic low level may be transferred to the sixth node N6. When the sixth node N6 is at a logic low level, the fourth sense transistor 316 may be turned-on. When the fourth sense transistor 316 is turned-on, the sense enable signal SENSE_EN may be the third clock signal CLK3.

In this case, the first sense enable signal SENSE_EN[1] may be at a logic low level. The sense input signal SENSE_IN input into the second scan sense driver 11 may be the first sense enable signal SENSE_EN[1]. In the second sense driver 300, the second sense enable signal SENSE_EN[2] may be generated in the same manner.

In an example embodiment, the controller 200 may control waveforms of the clock signals CLK1 to CLK3 based on the scan time interval SCTI and the sense time interval SETI. For example, the controller 200 may provide the clock signals CLK1 to CLK3. A time interval when the clock signals CLK1 to CLK3 provided during the scan time interval SCTI maintain a first logic level may be a first time interval. A time interval when the clock signals CLK1 to CLK3 provided during the sense time interval SETI maintain a first logic level may be a second time interval ST. The second time interval ST may be different from the first time interval. For example, the first logic level may be the logic low level and the second logic level may be the logic high level. The first time interval may be longer (e.g., two times longer) than a horizontal time 1H. The horizontal time 1H may be a predetermined time interval. The horizontal time 1H may be a time interval when the scan line is enabled.

In an example embodiment, a time interval between adjacent one of the clock signals CLK1 to CLK3 provided during the scan time interval SCTI may be a third time interval. For example, during the scan time interval SCTI, the time interval between the time when the first S-clock signal SCLK1 transitions from a logic high level to a logic low level and the time when the second S-clock signal SCLK2 transitions from a logic high level to a logic low level may be the third time interval. The third time interval may be the horizontal time 1H that is predetermined.

In an example embodiment, a time interval between adjacent ones of the clock signals CLK1 to CLK3 provided during the sense time interval SETI may be the second time interval ST. For example, during the sense time interval SETI, the time interval between the time when the first S-clock signal SCLK1 transitions from a logic high level to a logic low level and the time when the second S-clock signal SCLK2 transitions from a logic high level to a logic low level may be the second time interval ST. The second time interval ST may be may be greater than, for example, several microseconds. In an example embodiment, the first time interval may be greater than the third time interval. The second time interval ST may be greater than the first time interval. For example, the first time interval may be longer (e.g., two times longer) than a horizontal time 1H. The third time interval may be equal to the horizontal time 1H. In this case, the first time interval may be greater than the third time interval.

In an example embodiment, the first time interval may be equal to the third time interval. The first time interval and the third time interval may be a horizontal time 1H. The horizontal time 1H may be a predetermined time interval. The first time interval may be a time interval when the clock signals CLK1 to CLK3 provided during the scan time interval SCTI maintain the first logic level. The time interval when the clock signals CLK1 to CLK3 provided during the scan time interval SCTI maintain the first logic level may be a time interval when the scan line is enabled. The third time interval may be a time interval between adjacent ones of the clock signals CLK1 to CLK3 provided during the scan time interval SCTI.

In one embodiment, the scan sense driver 10 may decrease the layout area by generating the sense enable signal SENSE_EN and applying the clock signals CLK1 to CLK3 to the sense driver 300.

Figure 17:
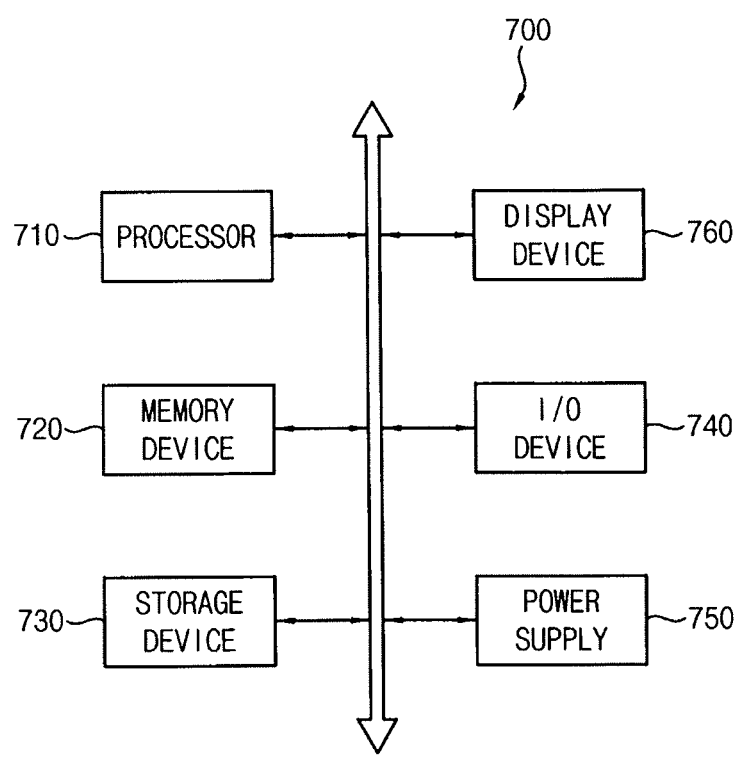
FIG. 17 illustrates an embodiment of a mobile device.

FIG. 17 illustrates an embodiment of a mobile device 700 which includes a processor 710, a memory device 720, a storage device 730, an input/output (I/O) device 740, a power supply 750, and an electroluminescent display device 760. The mobile device 700 may further include a plurality of ports for communicating a video card, a sound card, a memory card, a universal serial bus (USB) device, or other electronic systems.

The processor 710 may perform various computing functions or tasks. The processor 710 may be for example, a microprocessor, a central processing unit (CPU), etc. The processor 710 may be connected to other components via an address bus, a control bus, a data bus, etc. Further, the processor 710 may be coupled to an extended bus such as a peripheral component interconnection (PCI) bus.

The memory device 720 may store data for operations of the mobile device 700. For example, the memory device 720 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano-floating gate memory (NFGM) device, a polymer random access memory (PoRAM) device, a magnetic random access memory (MRAM) device, a ferroelectric random access memory (FRAM) device, and/or at least one volatile memory device such as a dynamic random access memory (DRAM) device, a static random access memory (SRAM) device, a mobile dynamic random access memory (mobile DRAM) device, etc.

The storage device 730 may be, for example, a solid state drive (SSD) device, a hard disk drive (HDD) device, a CD-ROM device, etc. The I/O device 740 may be, for example, an input device such as a keyboard, a keypad, a mouse, a touch screen, and/or an output device such as a printer, a speaker, etc. The power supply 750 may supply power for operating the mobile device 700. The electroluminescent display device 760 may communicate with other components via the buses or other communication links.

The present embodiments may be applied to any mobile device or any computing device. For example, the present embodiments may be applied to a cellular phone, a smart phone, a tablet computer, a personal digital assistant (PDA), a portable multimedia player (PMP), a digital camera, a music player, a portable game console, a navigation system, a video phone, a personal computer (PC), a server computer, a workstation, a tablet computer, a laptop computer, etc.

By way of summation and review, as the radiation time of an organic light-emitting diode increases, luminous efficiency may decrease. When the luminous efficiency of an organic light-emitting diode decreases, the image generated by a display device which includes the organic light-emitting diode may degrade.

In accordance with one or more of the aforementioned embodiments, a scan sense driver generates signals for testing a state (e.g., malfunction or other abnormal or aberrant condition) of an organic light-emitting diode, for example, in order to determine degradation taking place in a display device. In accordance with these or other embodiments, the scan sense driver decreases a layout area by generating a sense enable signal with one or more clock signals.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A scan sense driver, comprising:
   a scan line driver to provide a scan line enable signal based on a plurality of clock signals, a global clock signal, and a scan input signal during a scan time interval; and
   a sense driver to provide a sense enable signal based on the clock signals and a sense input signal during a sense time interval, wherein the sense driver is to provide the sense enable signal during a period when an organic light-emitting diode is to be tested.

2. The scan sense driver as claimed in claim 1, wherein waveforms of the clock signals provided during the scan time interval are different from the waveforms of the clock signals provided during the sense time interval.

3. The scan sense driver as claimed in claim 2, wherein:
   a time interval when the clock signals provided during the scan time interval have a first logic level is a first time interval,
   a time interval when clock signals provided during the sense time interval have the first logic level is a second time interval, and
   the second time interval is different from the first time interval.

4. The scan sense driver as claimed in claim 3, wherein the sense input signal has a second logic level during the scan time interval.

5. The scan sense driver as claimed in claim 3, wherein the scan input signal has a second logic level during the sense time interval.

6. The scan sense driver as claimed in claim 3, wherein:
   a time interval between adjacent ones of the clock signals provided during the scan time interval is a third time interval, and a time interval between adjacent ones of the clock signals provided during the sense time interval is the second time interval.

7. The scan sense driver as claimed in claim 6, wherein the first time interval is greater than the third time interval.

8. The scan sense driver as claimed in claim 7, wherein:
the first time interval is longer than a horizontal time having a predetermined time interval, and
the third time interval is substantially equal to the horizontal time.

9. The scan sense driver as claimed in claim 6, wherein the second time interval is greater than the first time interval.

10. The scan sense driver as claimed in claim 6, wherein the first time interval is substantially equal to the third time interval.

11. The scan sense driver as claimed in claim 10, wherein:
the first time interval and the third time interval correspond to a horizontal time, and
the horizontal time has a predetermined time interval.

12. The scan sense driver as claimed in claim 1, wherein:
the sense driver is to provide the sense enable signal based on a total operation time, and
the total operation time includes a time when the scan sense driver is to operate.

13. The scan sense driver as claimed in claim 1, wherein, the sense driver is to provide the sense enable signal when scan sense driver is turned-on.

14. A display device, comprising:
a controller to provide a plurality of clock signals, a global clock signal, a scan start pulse, and a sense start pulse;
a plurality of scan sense drivers to provide scan line enable signals and sense enable signals based on the clock signals, the global clock signal, the scan start pulse, and the sense start pulse; and
a pixel array to operate based on the scan line enable signals and the sense enable signals, wherein each of the scan sense drivers includes:
a scan line driver to provide the scan line enable signal based on the clock signals, the global clock signal, and a scan input signal during a scan time interval; and
a sense driver to provide the sense enable signal based on the clock signals and a sense input signal during a sense time interval, wherein the sense driver is to provide the sense enable signal during a period when an organic light-emitting diode of a pixel in the pixel array is to be tested.

15. The display device as claimed in claim 14, wherein:
the scan input signal input into a first scan sense driver of the plurality of scan sense drivers is the scan start pulse, and
the sense input signal input into the first scan sense driver of the plurality of scan sense drivers is the sense start pulse.

16. The display device as claimed in claim 14, wherein the pixel includes:
a scan driver to provide a voltage corresponding to data voltage to a organic light-emitting diode; and
a sensor to test for a malfunction of the organic light-emitting diode based on the sense enable signal.

17. The display device as claimed in claim 14, wherein the controller is to control waveforms of the clock signals based on the scan time interval and the sense time interval.

18. The display device as claimed in claim 17, wherein the controller provides the clock signals,
a time interval when the clock signals provided during the scan time interval have a first logic level is a first time interval,
a time interval when the clock signals provided during the sense time interval have the first logic level is a second time interval, and
the second time interval is different from the first time interval.

19. The display device as claimed in claim 18, wherein:
a time interval between adjacent ones of the clock signals provided during the scan time interval is a third time interval,
a time interval between adjacent ones of the clock signals provided during the sense time interval is the second time interval,
the first time interval is greater than the third time interval, and
the second time interval is greater than the first time interval.

20. The display device as claimed in claim 19, wherein:
the first time interval is equal to the third time interval,
the first time interval and the third time interval correspond to a horizontal time, and
the horizontal time is a predetermined time interval.

* * * * *